United States Patent [19]

Giolma et al.

[11] 4,110,707
[45] Aug. 29, 1978

[54] INDIRECT FM MODULATION SCHEME USING PHASE LOCKED LOOP

[75] Inventors: William Henry Giolma, Garland; Bernhard Hans Andresen, Dallas, both of Tex.

[73] Assignee: Texas Instruments Incorporated, Dallas, Tex.

[21] Appl. No.: 750,059

[22] Filed: Dec. 13, 1976

[51] Int. Cl.² .................................. H03C 3/10
[52] U.S. Cl. ........................ 332/19; 325/45; 325/148; 325/178; 325/184; 331/23
[58] Field of Search ............ 332/16 R, 19, 30 V; 331/23; 325/45, 148, 178–180, 184

[56] References Cited

U.S. PATENT DOCUMENTS

| | | | |
|---|---|---|---|
| 2,989,622 | 6/1961 | Doherty | 325/45 |
| 3,579,281 | 5/1971 | Kam et al. | 332/30 V |
| 4,009,455 | 2/1977 | Ishigaki et al. | 332/19 X |

OTHER PUBLICATIONS

Ostlund et al, "Center-Frequency-Stabilized Frequency Modulation System", IRE Proceedings, vol. 35, Oct. 1947, pp. 1144–1147.
Morgan, "Micro-power phase-locked loop widens designer's choice", Electronics, Sep. 25, 1972, pp. 121–122.

*Primary Examiner*—Siegfried H. Grimm
*Attorney, Agent, or Firm*—James T. Comfort; Rene' E. Grossman; James J. Elacqua

[57] ABSTRACT

A phase space locked loop system used for performing indirect frequency modulation. A phase locked loop is comprised of a phase detector coupled to a low pass filter coupled to a voltage controlled oscillator with a feedback loop to the phase detector. Input signals provided by a crystal controlled oscillator are fed to the phase detector. A phase difference other than 90° between the voltage controlled oscillator output and the input signal will result in the phase detector generating an error voltage which is filtered by the low pass filter to alter the voltage controlled oscillator until its phase is 90° from the input signal. A modulating signal is injected into the phase locked loop which causes the voltage controlled oscillator to momentarily change frequency until the output of the phase detector changes enough to balance the modulating signal.

8 Claims, 3 Drawing Figures

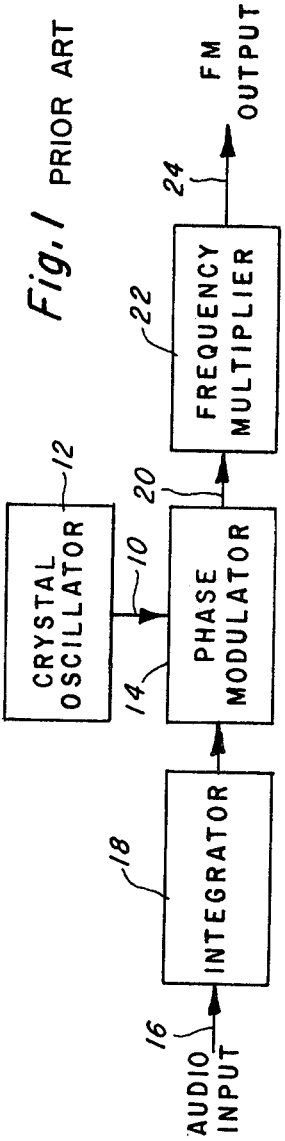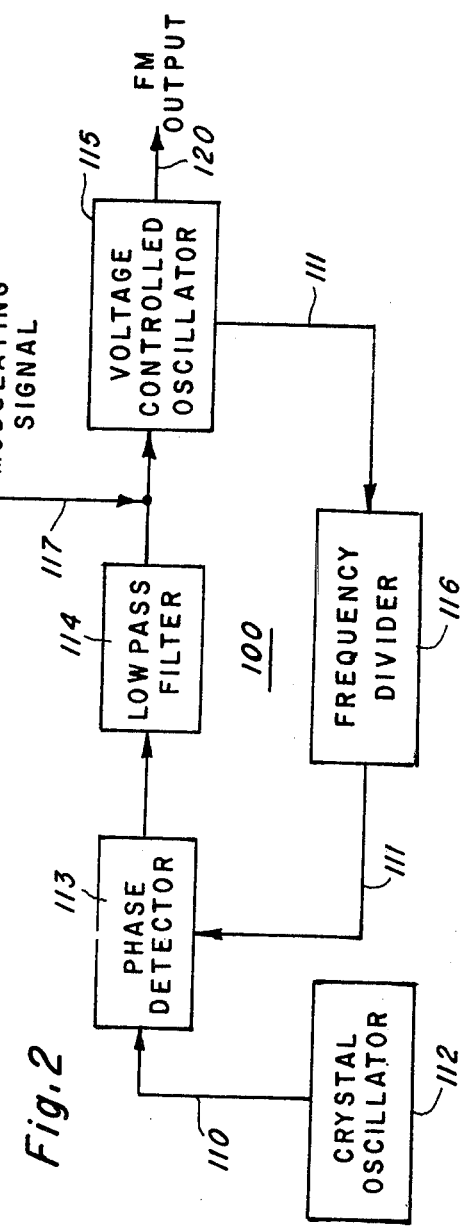

INDIRECT FM MODULATION SCHEME USING PHASE LOCKED LOOP

BACKGROUND OF THE INVENTION

This invention relates to indirect frequency modulators and more specifically to those indirect frequency modulators using phase locked loop techniques.

Phase locked loop techniques have been known since the early 1930's but had been somewhat avoided because of their high cost and complexity in discrete system design. With the developments in integrated circuit design and processing this situation is rapidly changing and phase locked loops are becoming versatile building blocks with many applications.

Basically a phase locked loop is a frequency feedback system comprised of a phase detector, a low-pass filter and a voltage controlled oscillator (VCO) with a feedback path. When the input signal to the loop is zero the voltage controlled oscillator operates at a predetermined free-running frequency. If an input signal is applied, usually by a crystal controlled oscillator, the phase detector compares the phase and frequency of the input signal with that of the voltage controlled oscillator and generates an error voltage that is related to the difference in the two signals. The error voltage is then filtered and applied to the control of the VCO, thereby varying the VCO frequency in a direction that reduces the frequency difference between the two signals. When the frequencies of the two signals become sufficiently close, the feedback nature of the system causes the system to lock with the incoming signal. Once in lock the VCO frequency is identical with the input signal, except for a finite phase difference which is necessary to generate the corrective error voltage to shift the VCO frequency to the input signal frequency, thus keeping the system in lock. The range of frequencies over which the loop can acquire lock with an incoming signal is called the "capture range." The range of frequencies over which the loop can maintain lock is called the "lock range" and is broader than the "capture range."

Used as a building block, the phase locked loop is suitable for a wide variety of applications including FM demodulation, frequency synchronization, signal conditioning and phase modulation.

In the art there is known to be two general methods for generating frequency modulated signals, namely, indirect FM and direct FM.

In the indirect method of producing frequency modulation, the modulating signal is first integrated and then phase modulates a crystal controlled oscillator signal to produce a narrow-band FM signal. Frequency multiplication is then used to increase the resulting frequency deviation to the desired level.

Direct FM systems are those in which the modulating signal directly controls the carrier frequency. In this system, the transmitter output frequency may be modulated directly without frequency multiplication, but there is a discriminator circuit needed for stabilization of the center frequency. In contrast, the indirect method requires a number of frequency multipliers to product wideband FM, but does not require added circuitry for carrier frequency stabilization.

Heretofore phase locked loops have been used for phase modulation, these systems being suitable building blocks for indirect frequency modulating systems. However, since frequency multipliers are needed in such a system to achieve adequate frequency deviation and such frequency multipliers consist of tuned circuits, full integration of such a system is not practical.

SUMMARY OF THE INVENTION

While the system to perform indirect frequency modulation by integrating the modulating signal and then using the same modulating signal to phase-modulate a crystal-controlled carrier frequency works satisfactorily, this approach uses many tuned circuits and does not lend itself to integration. In this system there is the added problem of alignment to obtain the desired levels of operation.

One solution to the problems surrounding methods of indirect frequency modulation is to use the properties and advantages of a phase lock loop system to perform the desired frequency modulation.

A phase lock loop (PLL) system that is capable of performing this desired modulation technique is the subject of the present invention. A crystal controlled oscillator provides an input signal to the PLL in the form of a sinusoid or a square wave. The PLL comprises a voltage controlled oscillator for converting voltage to frequency, connected to a phase detector which compares the phase of the input signal with that of the output signal of the voltage controlled oscillator. The phase comparator generates an error voltage that is related to the difference in the two signals. A low pass filter is also included in the PLL between the phase detector and the voltage controlled oscillator for filtering the error voltage. In order for the PLL to perform the indirect frequency modulation, a modulating signal is injected into the loop at a point between the low pass filter and voltage controlled oscillator. Once the PLL achieves a lock condition, when the frequency of the input signal and the output of the voltage controlled oscillator are sufficiently close, the system output will be a modulated version of the input signal. A frequency divider is included in the PLL feedback loop to maintain adequate frequency deviation at low modulating frequencies.

The frequency modulator resulting from the PLL configuration described above is also a key building block in a number of applications including FM transmitters. The design of such a transmitter includes a frequency modulator and appropriate tuned circuits, amplifiers and antennas.

BRIEF DESCRIPTION OF THE DRAWINGS

For a more complete understanding of the present invention and for further objects and advantages thereof, reference may now be had to the following description taken in conjunction with the accompanying drawings in which:

FIG. 1 is a block diagram illustrating a prior art system for indirect frequency modulation;

FIG. 2 is a block diagram illustrating an indirect frequency modulation system in accordance with the present invention;

DETAILED DESCRIPTION

Figure 3:
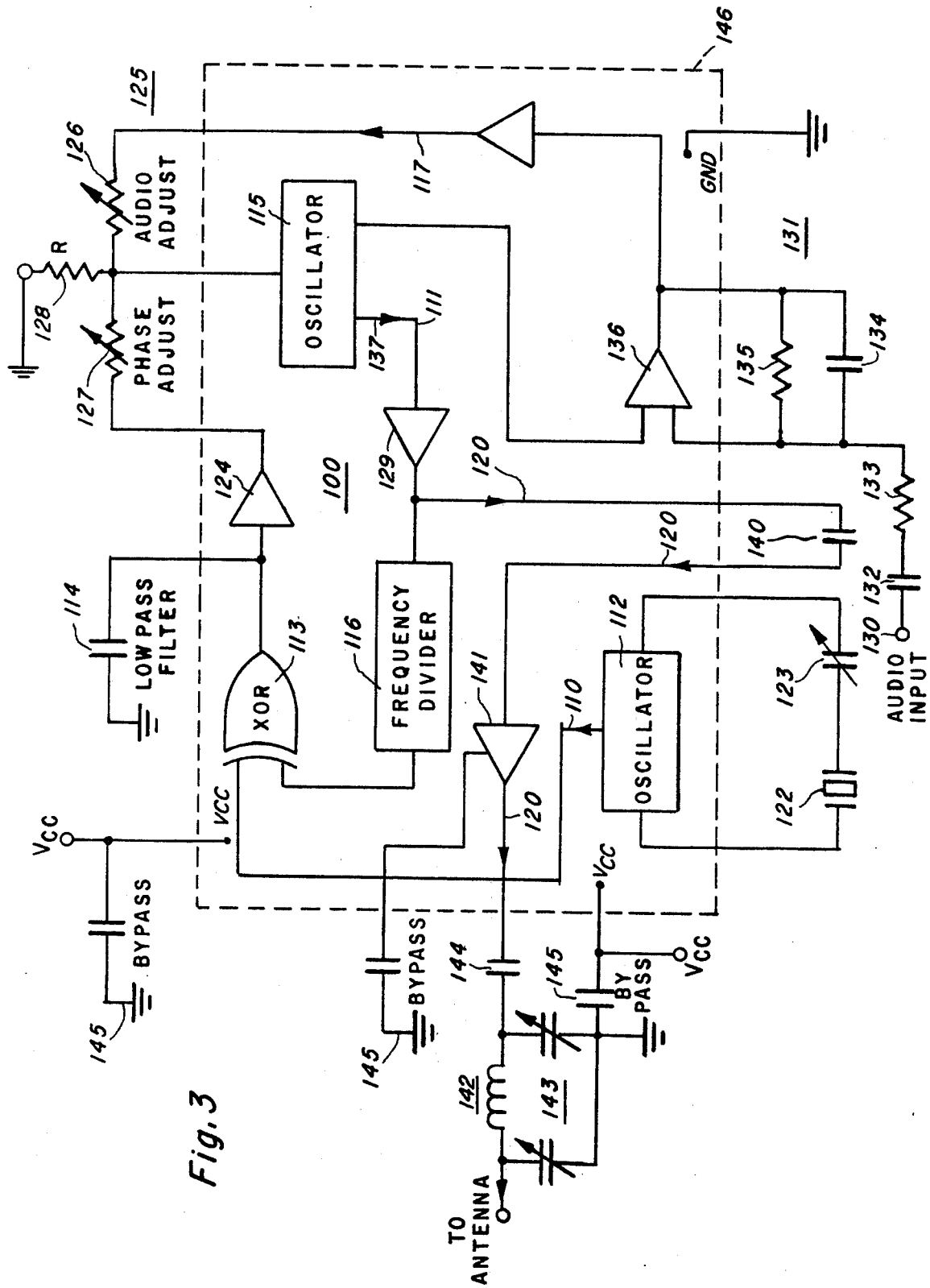
FIG. 3 is a circuit diagram of a transmitter utilizing indirect frequency modulation in accordance with the present invention.

Referring to FIG. 1, there is shown a prior art system used for indirect frequency modulation. The system includes an integrator 18, a phase modulator 14, and a frequency multiplier 22 connected in series, and a crystal controlled oscillator 12. An input signal 10 is generated by the crystal controlled oscillator 12, which may be of the type manufactured by Motorola, Phoenix, Arizona, Model MC 12060. This input signal 10 is fed into an input of the phase modulator 14. The phase modulator 14 may be of the type manufactured by RCA, Somerville, New Jersey, Model TA 6291.

An audio signal 16 is generated and integrated by the integrator 18 which may comprise a resistor-capacitor network, for example. This integrated audio signal 16 is then fed into the phase modulator 14. The resulting signal 20 passing through the phase modulator 14 is then frequency multiplied to produce the desired wideband FM signal 24 by the frequency multiplier 22, which may be of a standard type comprising discrete components in a harmonic amplifier circuit.

The phase modulator 14 may be in the form of a phase locked loop rather than the Model TA 6291 manufactured by RCA, Somerville, New Jersey. In such a system, a reference signal is fed into a phase detector through a low pass filter and then combined with a phase modulating signal before being input to a voltage controlled oscillator. The result is a phase modulated signal using a phase locked loop. However, the frequency multiplier 22 used in this indirect frequency modulation scheme contains tuned circuits which are not easily integrated.

Referring to FIG. 2, a block diagram showing an indirect frequency modulation scheme in accordance with the present invention using a phase locked loop 100, where the entire system is conducive to integration, is illustrated.

An input reference signal 110 is generated by a crystal controlled oscillator 112 of the type manufactured by Motorola, Phoenix, Arizona, Model MC 12060. The input reference signal 110 can be a square wave signal or sinusoidal. A phase detector 113 of the type manufactured by Texas Instruments Incorporated, Dallas, Texas, Model Number SN5486, in the form of an exclusive "or" logic gate, receives the input reference signal 110 from the crystal controlled oscillator 112. A low pass filter 114 comprising a resistor-capacitor network, for example, is connected to the output of the phase detector 113. The low pass filter 114 feeds information regarding the frequency and phase of the input reference signal 110 to a voltage controlled oscillator 115 and example of which is Model SN54S124 made by Texas Instruments Incorporated, Dallas, Texas. The voltage controlled oscillator 115 provides an output signal 120 as the FM output and further has an output connected to a frequency divider 116, as Model SN5493A made by Texas Instruments Incorporated, Dallas, Texas, in a feedback loop 111 which is connected to an input of the phase detector 113. A modulating signal 117 is fed into the phase locked loop 100 at the output of the low pass filter 114 between the low pass filter 114 and the voltage controlled oscillator 115. The output signal 120 as generated by the voltage controlled oscillator 115 is delivered to appropriate transmission networks.

Operationally, when the input reference signal 110 is zero, the phase detector 113 does not generate any error voltage for controlling the voltage controlled oscillator 115. Under these conditions, the voltage controlled oscillator 115 operates at a predetermined frequency known as the "free-running" frequency. If an input signal is applied to the system, however, the phase detector 113 compares the phase and the frequency difference between the input signal 110 and the voltage controlled oscillator signal and generates an error voltage related to this difference. This error voltage is then filtered by the low pass filter 114 and applied to the control terminal (not shown) of the voltage controlled oscillator. In this manner, the control forces the voltage controlled oscillator 115 to vary frequency in a direction that reduces the frequency difference between the two signals. When the two frequencies are sufficiently close, the feedback nature of the phase locked loop 100 causes the voltage controlled oscillator 115 to synchronize with the incoming signal 110. The system as operationally described thus far is representative of a standard phase locked loop system.

In accordance with the present invention, a frequency divider 116 and a modulating signal 117 are included in the phase locked loop 100. Providing the frequency divider 116 in the feedback loop 111 of the system will cause frequency multiplication of the output signal. This multiplication is caused by the increase in error voltage generated by the phase detector 113 as a result of the increase in the frequency difference between the input signal 110 and the voltage controlled oscillator frequency caused by the frequency divider 116 in the feedback loop 111. The increased error voltage is delivered to the control of the voltage controlled oscillator 115 which increases the frequency output of that device.

The modulating signal 117 is injected into the loop by an integrator circuit (not shown) to enable the phase locked loop system 100 to perform indirect frequency modulation. An example of such a modulating signal is an audio signal. As in indirect frequency modulation, the modulating signal 117 is first integrated and then used to phase modulate an input reference signal. After the modulating signal 117 is integrated, it phase modulates the input reference signal 110 using the operation of the phase locked loop 100. Frequency multiplication for providing adequate wideband frequency modulation is present in the phase locked loop 100 feedback path 111 in the form of the frequency divider 116 as previously explained. The result is a wideband FM signal 120 obtained from a system that is fully integratable.

An FM transmitter using the frequency modulator of FIG. 2 as described is shown in FIG. 3. In this instance, the input reference signal 110 is delivered to the phase locked loop 100 by a crystal controlled oscillator 112, where a crystal element 122 and variable capacitor 123 control the frequency oscillator 112. The input reference signal 110 enters the phase locked loop 100 through a phase detector 113 shown in the FIG. 3 to be in the form of an exclusive "or" logic gate.

The phase detector 113 is connected to a low pass filter 114 which filters the error voltage generated by the phase detector 113 as described above in the operation of the device illustrated in FIG. 2. An amplifier 124 amplifies the error voltage and delivers it to a resistor network 125 which may comprise an audio adjust variable resistance 126, a phase adjust variable resistance 127 and a divider resistor 128 that controls the voltage controlled oscillator 115. Based upon the error voltage received, the voltage controlled oscillator 115 delivers its frequency output signal.

A modulating signal 117 is injected into the phase locked loop 100 and mixes with the output delivered by the phase detector 113. An audio signal 130 is one example of such a modulating signal as shown in FIG. 3. Before entering the phase locked loop 100, however, the audio signal 130 passes through an integrator 131. Integrator 131 includes an audio coupling capacitor 132 in series with a resistor 133. This series circuit is connected to the parallel combination of an integrating capacitor 134 and resistor 135. An amplifier 136 is connected to this combination of passive circuit elements and delivers the integrated audio signal 117 to the phase locked loop 100. The signal 117 then mixes with the output of the phase detector 113.

The frequency divider 116 receives the signal 137 and provides adequate frequency deviation for wideband FM. A frequency output signal 120 is obtained by tapping the phase locked loop 100 between amplifier 129 and the frequency divider 116. Output signal 120 is then passed through a coupling capacitor 140 and a power amplifier 141 before entering a tuning circuit 142. The tuning circuit 142 includes a Pi network 143, that filters out harmonics of the signal and avoids clipping in the case of a sinusoidal waveform, and a coupling capacitor 144.

Bypass circuits 145 are used to short out the AC component of the dc power supply Vcc. Vcc a common voltage supply of dc power is supplied to all active circuit components when integrated on one integrated circuit chip as demonstrated by the outlining rectangle 146. The signal 120 is then delivered to an antenna for transmission.

Although the present invention has been shown and illustrated in terms of specific embodiments, it will be apparent that changes or modifications can be made without departing from the spirit and scope of the invention as defined by the appended claims.

What is claimed is:

1. An indirect frequency modulator comprising:
   first oscillator means for providing a continuous periodic input reference signal;
   a phase locked loop connected to said first oscillator means including:
      second oscillator means for voltage to frequency conversion,
      phase detector means disposed within said phase locked loop and connected to said first oscillator means for comparing the phase of the input reference signal and the signal generated by said second oscillator means and generating an error signal proportional to any phase difference of the two signals,
      low-pass filter means disposed within said phase locked loop and located between said phase detector means and said second oscillator means for receiving, filtering and delivering said error signal to said second oscillator means,
      a feedback loop from said second oscillator means to said phase detector means, and
      a frequency divider disposed within said phase locked loop and located in said feedback loop for delivering said signal generated by said second oscillator means to said phase detector means;
   modulating signal generating means connected through integrating means to said phase locked loop between said low-pass filter means and said second oscillator means for indirect frequency modulating said input reference signal.

2. An indirect frequency modulator as set forth in claim 1, wherein said first oscillator means comprises a crystal controlled oscillator.

3. An indirect frequency modulator as set forth in claim 1, wherein said second oscillator means comprises a voltage controlled oscillator.

4. An indirect frequency modulator as set forth in claim 3, wherein said phase detector means comprises an exclusive "or" logic gate.

5. An indirect frequency modulator as set forth in claim 4, wherein said low-pass filter means comprises a capacitor.

6. An indirect frequency modulator as set forth in claim 1, wherein said modulating signal generating means includes an audio signal source connected to integrating amplifier circuitry.

7. An indirect frequency modulator as set forth in claim 5, further including amplifier circuitry disposed between the low-pass filter means and the second oscillator means.

8. An FM signal transmitter including:
   an indirect frequency modulator comprising:
      first oscillator means for providing a sinusoidal input reference signal;
      a phase locked loop comprising:
         second oscillator means for voltage to frequency conversion,
         phase detector means disposed within said phase locked loop and connected to said first oscillator means for comparing the phase of the input reference signal and the signal generated by said second oscillator means and generating an error signal proportional to any phase difference in the two signals,
         low-pass filter means disposed within said phase locked loop and located between said phase detector means and said second oscillator means for receiving, filtering and delivering said error signal to said second oscillator means,
         a feedback loop from said second oscillator means to said phase detector means, and
         a frequency divider disposed within said phase locked loop and located in said feedback loop for delivering said signal generated by said second oscillator means to said phase detector means;
      modulating signal generating means connected through integrating means to the connection between said low-pass filter means and said second oscillator means for indirect frequency modulating said input reference signal;
   and further including:
      system output signal circuitry means connected to said phase locked loop between said second oscillator means and said frequency divider for delivering said signal generated by said second oscillator means and having,
         power amplifier means for boosting the signal generated by the second oscillator means,
         filter means connected to said power amplifier means for filtering any harmonics in said output signal, and
         antenna means for transmitting said output signal.

* * * * *